United States Patent [19]
Fukuzo

[11] Patent Number: 6,154,385
[45] Date of Patent: Nov. 28, 2000

[54] SEMICONDUCTOR MEMORY WITH BUILT-IN ROW BUFFER AND METHOD OF DRIVING THE SAME

[75] Inventor: Yukio Fukuzo, Tokyo, Japan

[73] Assignee: NEC Corporation, Tokyo, Japan

[21] Appl. No.: 09/163,169

[22] Filed: Sep. 30, 1998

[30] Foreign Application Priority Data

Sep. 30, 1997 [JP] Japan .................................. 9-266473

[51] Int. Cl.⁷ .................................................. E11C 8/00
[52] U.S. Cl. ........................................ 365/51; 365/230.08
[58] Field of Search .......................... 365/51, 63, 230.03, 365/230.05, 208

[56] References Cited

U.S. PATENT DOCUMENTS

| | | | |
|---|---|---|---|
| 4,649,516 | 3/1987 | Chung et al. | 364/900 |
| 5,025,421 | 6/1991 | Cho | 365/230.05 |
| 5,323,350 | 6/1994 | Mclaury | 365/208 |
| 5,568,427 | 10/1996 | Takemae | 365/230.03 |

*Primary Examiner*—David Nelms
*Assistant Examiner*—M. Tran
*Attorney, Agent, or Firm*—Foley & Lardner

[57] ABSTRACT

There is provided a semiconductor memory including a plurality of sub-arrays each of which includes a plurality of cells arranged in a matrix, at least one word line connected to gates of cells arranged in a first direction among the cells, at least one bit line for providing a data-writing signal to one of electrodes of cells arranged in a second direction among the cells, the second direction being perpendicular to the first direction, at least one ground line for reading data out of the other of the electrodes of cells arranged in the second direction, a plurality of sense-amplifiers associated with each of the sub-arrays for providing a sense-amplifying current to the bit line, and a plurality of row buffers connected to all of the sub-arrays for retaining data of a cell selected by the word line. In accordance with the above-mentioned semiconductor memory, a plurality of row buffers for retaining data stored in cells in a sub-array selected by a word line are connected to all of the sub-arrays. Hence, it is possible to reduce internal I/O buses, which further makes it possible to avoid that a semiconductor chip is increased in size because of an increase of internal I/O buses. In addition, since it is no longer necessary to form a three-layered aluminum structure, a fabrication cost can be suppressed from increasing. Furthermore, since data transmission can be conducted between row buffers and external circuits, a data transmission speed can be enhanced.

25 Claims, 3 Drawing Sheets

SEMICONDUCTOR MEMORY WITH BUILT-IN ROW BUFFER AND METHOD OF DRIVING THE SAME

BACKGROUND OF THE INVENTION

1. Field of the Invention

The invention relates to a semiconductor memory such as DRAM, ROM and a flash memory, and more particularly to such a semiconductor memory with a built-in row buffer.

2. Description of the Related Art

As illustrated in FIG. 1, a conventional semiconductor memory with a built-in row buffer is usually comprised of a sub-array 11 having a capacity of 256 Kbit, and a line row buffer 12 which is capable of storing data of sixteen rows of cells of the sub-array 11. The row buffer 12 is arranged for each one of the sub-arrays 11, and is connected to a common I/O bus (not illustrated). The row buffer 12 retains both external data to be transmitted to the sub-array 11 from an external peripheral circuit through the common I/O bus, and data read out of the sub-array 11 and transmitted to an external peripheral circuit.

As mentioned above, the row buffers arranged for each one of the sub-arrays are connected to the common I/O bus in a conventional semiconductor memory. In order to accomplish such a connection, it is necessary to form an internal I/O bus constituted of a lot of bus lines between each of the row buffers and the common I/O bus, with such structure requires a large semiconductor chip due to the internal I/O bus.

If one attempts to eliminate the internal I/O bus in order to avoid the semiconductor chip from becoming larger in size, it would be necessary to form three-layered aluminum wirings on the semiconductor substrate, which will be accompanied with a problem that a cost for fabricating a semiconductor device.

SUMMARY OF THE INVENTION

It is an object of the present invention to provide a semiconductor memory with a built-in row buffer, which avoids increasing the size and cost of fabrication. It is also an object of the present invention to provide a method of driving such a semiconductor memory.

In one aspect of the present invention, there is provided a semiconductor memory including (a) a plurality of sub-arrays each of which includes a plurality of cells arranged in a matrix, (b) at least one word line connected to gates of cells arranged in a first direction among the cells, (c) at least one bit line for providing a data-writing signal to one of electrodes of cells arranged in a second direction among the cells, the second direction being perpendicular to the first direction, (d) at least one ground line for reading data out of the other of the electrodes of cells arranged in the second direction, (e) a plurality of sense-amplifiers associated with each of the sub-arrays for providing a sense-amplifying current to the bit line, and (f) a plurality of row buffers connected to all of the sub-arrays for retaining data of a cell selected by the word line.

There is further provided a semiconductor memory including (a) a plurality of sub-arrays each of which includes a plurality of cells arranged in a matrix, (b) at least one word line connected to gates of cells arranged in a first direction among the cells, (c) at least one bit line for providing a data-writing signal to one of electrodes of cells arranged in a second direction among the cells, the second direction being perpendicular to the first direction, (d) at least one ground line for reading data out of the other of the electrodes of cells arranged in the second direction, (e) a plurality of sense-amplifiers associated with each of the sub-arrays for providing a sense-amplifying current to the bit line, (f) a plurality of row buffers connected to all of the sub-arrays for retaining data of a cell selected by the word line, and (g) a dirty bit for indicating whether data to be processed is stored in an associated row buffer.

It is preferable that each of the sense-amplifiers is comprised of first and second sense-amplifiers positioned at opposite sides of each of the sub-arrays, and that the row buffers are comprised of first row buffers for retaining data written into the sub-arrays through the first sense-amplifiers and data input thereinto from the sub-arrays through the first sense-amplifiers, and second row buffers for retaining data written into the sub-arrays through the second sense-amplifiers and data input thereinto from the sub-arrays through the second sense-amplifiers, in which case, data transmission through the first and second row buffers is carried out in time-sharing.

It is preferable that each of sub-arrays is connected to the first sense-amplifier through a certain number of bit lines, and connected further to the second sense-amplifier through the same number of bit lines.

It is preferable that the semiconductor memory further includes a first controller for, if the dirty bit indicates that data to be processed is stored in an associated row buffer when data is to be transmitted to the associated row buffer, transmitting data stored in the associated row buffer to an associated sub-array before transmitting data into the associated row buffer.

It is also preferable that the semiconductor memory further includes a second controller for, if the dirty bit indicates that data to be processed is stored in an associated row buffer when data is to be transmitted to the associated row buffer, transmitting data stored in the associated row buffer to an empty row buffer before transmitting data into the associated row buffer.

If the semiconductor memory includes both the first and second controllers, it is preferable that the second controller has a higher data-reading and writing speed than that of the first controller.

It is also preferable that some data is stored in the row buffers, specifically, in the first and/or second row buffers.

There is still further provided a semiconductor memory including (a) a plurality of sub-arrays each of which includes a plurality of cells, and (b) at least one row buffer connected to all of the sub-arrays, wherein data transmission between an external circuit and the sub-arrays is accomplished through the row buffer.

In another aspect of the present invention, there is provided a method of driving a semiconductor memory, including the steps of (a) transmitting a first signal to a selected word line of a selected sub-array when an external circuit transmits an access signal to the sub-array, (b) transmitting a second signal to a first sense-amplifier associated with the selected sub-array to thereby write data stored in a first row buffer, into a row of cells connected to the selected word line, or read data out of a row of cells connected to the selected word line, into the first row buffer, (c) pre-charging the sub-array, and (d) transmitting a third signal to a second sense-amplifier associated with the selected sub-array to thereby write data stored in a second row buffer, into a row of cells connected to the selected word line, or read data out of a row of cells connected to the selected word line, into the second row buffer.

The above-mentioned method may further include the step of transmitting data stored in a row buffer to an associated sub-array before transmitting data into the row buffer, if data is already stored in the row buffer, and/or the step of transmitting data stored in a row buffer to another empty row buffer before transmitting data into the row buffer, if data is already stored in the row buffer.

It is preferable that the method further includes the step of storing some data in one of the first and second row buffers.

In accordance with the above-mentioned semiconductor memory, a plurality of row buffers for retaining data stored in selected cells in a sub-array selected by a word line are connected to all of the sub-arrays. Hence, it is possible to reduce internal I/O buses, which further makes it possible to avoid that a semiconductor chip is increased in size because of an increase of internal I/O buses. In addition, since it is no longer necessary to form a three-layered aluminum structure, a fabrication cost can be suppressed from increasing. Furthermore, since data transmission can be conducted between row buffers and external circuits, a data transmission speed can be enhanced.

In addition, since the sense-amplifier is comprised of the first and second sense-amplifiers, and the row buffer is comprised of the above-mentioned first and second row buffers, wherein data transmission between the first and second row buffers is accomplished in time-sharing, it is possible to reduce a semiconductor memory chip in size, and enhance a data transmission efficiency.

Furthermore, by arranging the dirty bit for each one of the row buffers for indicating whether data is stored in a row buffer, it is possible to certainly transmit data to a desired row buffer.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1:
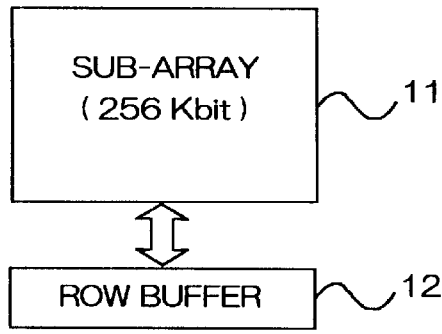
FIG. 1 is a block diagram of a conventional semiconductor memory.
Figure 2:
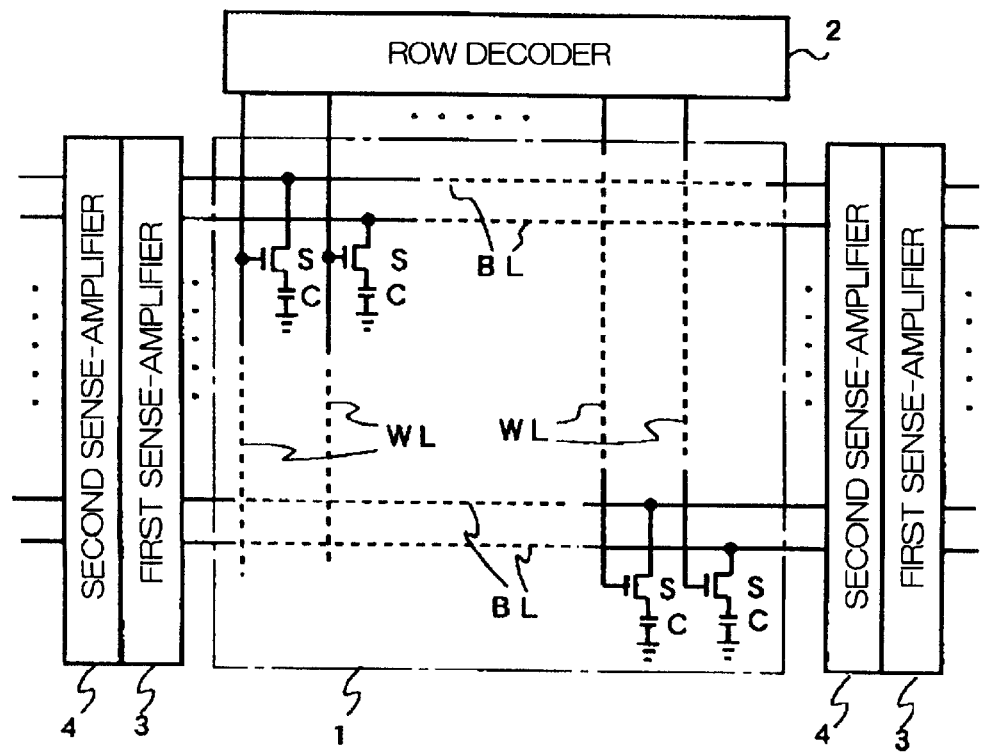
FIG. 2 is a partial block diagram of a semiconductor memory with a built-in row buffer, in accordance with a preferred embodiment of the present invention.

FIG. 2 is a partial block diagram of a semiconductor memory in accordance with a preferred embodiment of the present invention. The illustrated semiconductor memory is comprised of a sub-array 1 including a plurality of cells S constituted of a MOS transistor and having a capacity of 32 Mbit, arranged in a matrix, a row decoder 2 connected to word lines WL, and first and second sense-amplifiers (SA) 3 and 4 located at the opposite sides of the sub-array 1. The first and second sense-amplifiers 3 and 4 selects a source of the cell S through a bit line BL, and writes data into the thus selected cell S or reads data out of the thus selected cell S.

If 1,024 bit lines BL, for instance, are positioned at only one of the sides of the sub-array 1 including a plurality of cells S each having a capacity of 32 Mbit, it would be unavoidable for a whole semiconductor memory chip to become large in size. Hence, for the purpose of avoiding this, 512 bit lines BL are positioned at opposite sides of the sub-array 1. The 512 bit lines BL positioned at the left of the sub-array 1 are connected to the first sense-amplifier 3, and the 512 bit lines BL positioned at the right of the sub-array 1 are connected to the second sense-amplifier 4, so that the totally 1,024 bit lines BL can be selected in time-sharing.

When data is to be written into a desired cell S in the sub-array 1, a desired cell S is selected by the row decoder 2 through the word line WL, and a gate of the thus selected cell S is turned on. At the same time, the first or second sense-amplifier 3 or 4 provides a current to a source of the thus selected cell S through the bit line BL. As a result, when data to be written is "1", electric charge C indicating data "1" is accumulated in a drain of the selected cell S. On the other hand, when data to be written is "0", electric charge C is not accumulated in a drain of the selected cell S, and accordingly, data "0" is stored in the selected cell S.

After data has been written into the selected cell S in such a manner as mentioned above, when data is to be read out of the selected cell S, a ground line (not illustrated) connected to a drain of the selected cell S is turned to "L" level. As a result, the electric charge C having been accumulated in the drain of the selected cell S is discharged to the sense-amplifier through the ground line. Thus, it is confirmed that data "1" was stored in the selected cell S, by detecting the discharged electric charge C. When data "0" has been accumulated in the selected cell S, no electric charge is discharged to the selected cell S. Thus, it is confirmed that data "0" was stored in the selected cell S, by detecting no discharge of the electric charge C.

Figure 3:
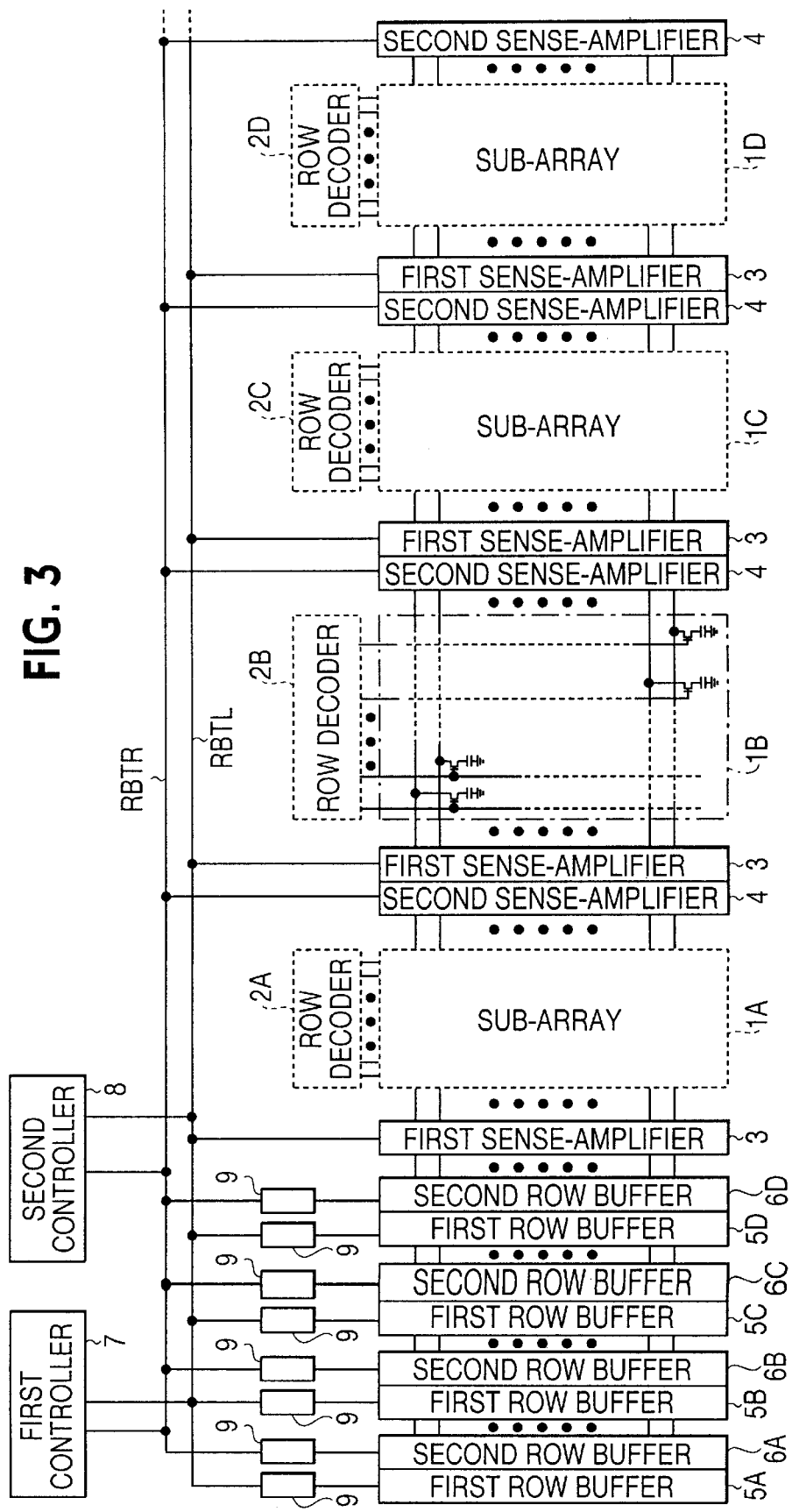
FIG. 3 is a block diagram of a semiconductor memory with a built-in row buffer, in accordance with a preferred embodiment of the present invention.

FIG. 3 is a full block diagram of the semiconductor memory in accordance with the embodiment. The illustrated semiconductor memory includes four sub-arrays 1A, 1B, 1C, and 1D, and row decoders 2A, 2B, 2C, and 2D each associated with the sub-arrays 1A, 1B, 1C, and 1D, respectively. The first and second sense-amplifiers 3 and 4 are arranged at the opposite sides of each one of the sub-arrays 1A, 1B, 1C, and 1D.

The semiconductor memory further includes first row buffers 5A, 5B, 5C, and 5D, and second row buffers 6A, 6B, 6C, and 6D. Each one of the row buffers 5A, 5B, 5C, 5D, 6A, 6B, 6C, and 6D is designed to have a capacity sufficient to retain data of a row of cells selected through a word line WL of each of the sub-arrays 1A, 1B, 1C, and 1D. Data transmitted through the first sense-amplifier 3 is stored into the first row buffers 5A, 5B, 5C, and 5D, and data transmitted through the second sense-amplifier 4 is stored into the second row buffers 6A, 6B, 6C, and 6D.

Data to be written through the first sense-amplifier 3 into a row of cells selected through a certain word line WL in the sub-array 1A, for instance, is retained in the first row buffer 5A, for instance. In such a case, data to be written through the second sense-amplifier 4 into a row of cells selected through a certain word line WL in the sub-array 1A is retained in the second row buffer 6A.

Similarly, data to be written through the first sense-amplifier 3 into a row of cells selected through a certain word line WL in the sub-array 1B, for instance, is retained in the first row buffer 5B, for instance. In such a case, data to be written through the second sense-amplifier 4 into a row of cells selected through a certain word line WL in the sub-array 1B is retained in the second row buffer 6B.

Figure 4:
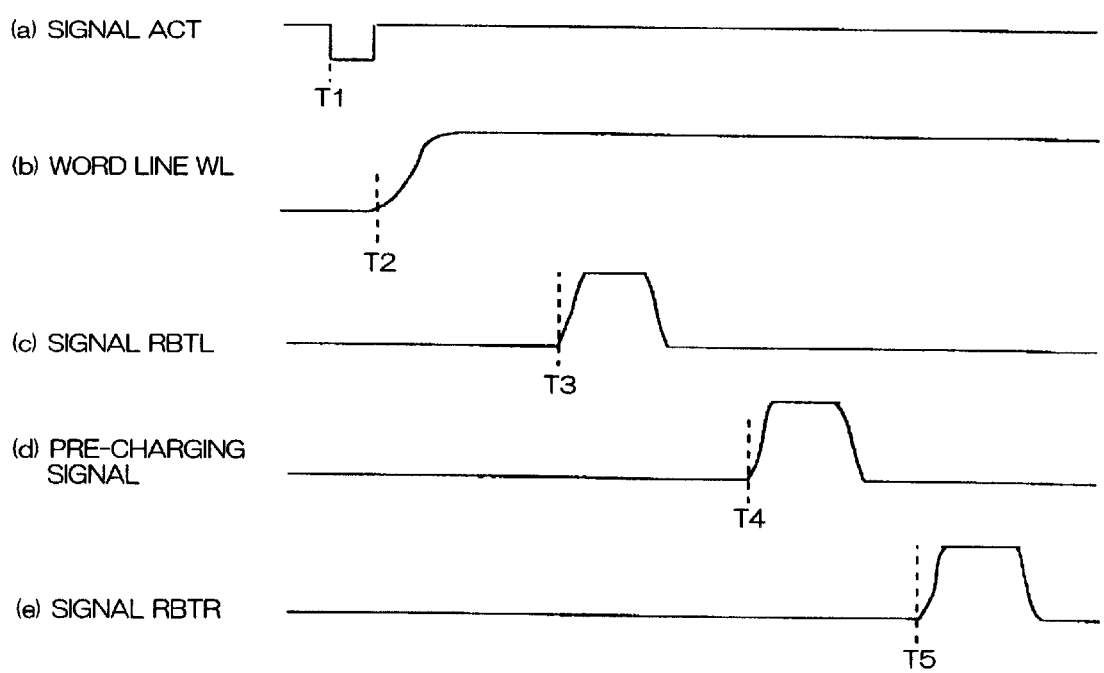
FIG. 4 is a timing chart illustrating timing at which elements of the semiconductor memory operate.

An operation of the semiconductor memory illustrated in FIG. 3 is explained hereinbelow with reference to FIG. 4.

When an external periphery circuit (not illustrated) transmits an access signal ACT to the sub-array 1 at time T1, as illustrated in FIG. 4(a) the row decoder 2 transmits a signal to a selected word line WL in the sub-array 1 at time T2 in response to the access signal ACT as illustrated in FIG. 4(b). Then, a signal RBTL is transmitted to the first sense-amplifier 3 of the sub-array 1 at time T3, as illustrated in FIG. 4(c). As a result, data stored in one of the first row buffers 5A to 5D is written into a row of cells S connected to the selected word line WL in the sub-array 1, or data stored in a row of cells S connected to the selected word line WL is read out, and transferred to one of the first row buffers 5A to 5D. Data transferred to one of the first row buffers 5A to 5D is further transferred to an external periphery circuit through a two-layered aluminum bus (not illustrated).

Then, at time T4, the sub-array 1 is pre-charged by a pre-charging circuit (not illustrated), as illustrated in FIG. 4(d). After pre-charging has been completed, a signal RBTR is output to the second sense-amplifier 4 of the sub-array 1 at time T5, as illustrated in FIG. 4(e). As a result, data stored in one of the second row buffers 6A to 6D is written into a row of cells S connected to the selected word line WL in the sub-array 1, or data stored in a row of cells S connected to the selected word line WL is read out, and transferred to one of the second row buffers 6A to 6D. Data transferred to one of the second row buffers 6A to 6D is further transferred to an external periphery circuit through a two-layered aluminum bus (not illustrated).

As explained above, data transmission through the first and second row buffers 5A to 5D and 6A to 6D is accomplished in a time-sharing manner.

In brief, the semiconductor memory in accordance with the embodiment is designed to have a plurality of row buffers connected to all of sub-arrays, wherein data transmission between an external periphery circuit (not illustrated) and sub-arrays is accomplished all through the row buffers.

Data which is often used in the sub-array 1 may be stored in one of the first and second row buffers 5A to 5D and 6A to 6D. By doing so, when an external periphery circuit makes access to data stored in the sub-array 1, the external periphery circuit can make direct access to the row buffer, which ensures enhancement in a data transmission efficiency.

Though a conventional semiconductor memory arranges a row buffer for each one of sub-arrays having a relatively small capacity, 256 Kbit, the semiconductor memory in accordance with the embodiment arranges the row buffers common to the sub-arrays 1A to 1D each having a relatively large capacity, 32 Mbit, which makes it possible to prevent internal I/O buses from increasing. Hence, it is possible to avoid a semiconductor chip from becoming larger in size due to an increase in internal I/O buses. In addition, since it is no longer necessary to form a three-layered aluminum structure on a semiconductor substrate, an increase in a cost for fabricating a semiconductor chip can be prevented.

As illustrated in FIG. 3, the semiconductor memory in accordance with the embodiment further includes dirty bits 9 in association with each one of the row buffers 5A, 5B, 5C, 5D, 6A, 6B, 6C, and 6D.

If the dirty bit 9 indicates "0", data stored in an associated row buffer is not rewritten. Hence, it is possible to make access to the associated row buffer, rewrite data in the associated row buffer, and read out and transfer the thus rewritten data.

If the dirty bit 9 indicates "1", data stored in an associated row buffer is rewritten. Hence, it is no longer possible to rewrite data stored in the associated row buffer.

The semiconductor memory further includes a first controller 7 in order to write data into a row buffer storing data which has been already rewritten. The first controller 7 transmits data stored in such a row buffer to an associated sub-array through an associated sense-amplifier. Thus, the row buffer is made empty. Then, the first controller 7 writes data into the row buffer.

As an alternative, the semiconductor memory may include a second controller 8 in order to write data into a row buffer storing data which has been already rewritten. The second controller 8 transmits data stored in such a row buffer to an empty row buffer. Thus, the firstly mentioned row buffer is made empty. Then, the second controller 8 transmits data into the row buffer.

Comparing the first and second controllers 7 and 8 to each other, the second controller 8 can read data out of and write data into a row buffer more rapidly than the first controller 7.

In accordance with the above-mentioned embodiment, a plurality of row buffers are arranged common to all of sub-arrays, and a dirty bit is arranged for each one of the row buffers for indicating whether the row buffer stores unprocessed data or not. When data transmitted from external circuits and/or data read out of a sub-array are(is) to be stored in a row buffer, it is possible to know that a row buffer is full of data or empty, by means of the dirty bit 9 before conducting data transmission.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-266473 filed on, Sep. 30, 1997 including specification, claims, drawings and summary is incorporated herein by reference in its entirety.

What is claimed is:

1. A semiconductor memory comprising:
   (a) a plurality of sub-arrays each of which includes a plurality of cells arranged in a matrix;
   (b) at least one word line connected to gates of cells arranged in a first direction among said cells;
   (c) at least one bit line for providing a data-writing signal to one of electrodes of cells arranged in a second direction among said cells, said second direction being perpendicular to said first direction;
   (d) at least one ground line for reading data out of the other of said electrodes of cells arranged in said second direction;
   (e) a plurality of sense-amplifiers associated with each of said sub-arrays for providing a sense-amplifying current to said bit line;
   (f) a plurality of row buffers connected to all of said sub-arrays for retaining data of a cell selected by said word line;
   wherein each of said sense-amplifiers is comprised of first and second sense-amplifiers positioned at opposite sides of each of said sub-arrays;
   wherein said row buffers are comprised of first row buffers for retaining data written into said sub-arrays through said first sense-amplifiers and data input thereinto from said sub-arrays through said first sense-amplifiers and second row buffers for retaining data written into said sub-arrays through said second sense-amplifiers and data input thereinto from said sub-arrays through said second sense-amplifiers; and data transmission through said first and second row buffers being carried out in a time-sharing manner.

2. The semiconductor memory as set forth in claim 1, wherein each of sub-arrays is connected to said first sense-amplifier through a certain number of bit lines, and connected further to said second sense-amplifier through the same number of bit lines.

3. The semiconductor memory as set forth in claim 1, wherein some data is stored in said row buffers.

4. The semiconductor memory as set forth in claim 1, wherein some data is stored in said first and second row buffers.

5. A semiconductor memory comprising:
   (a) a plurality of sub-arrays each of which includes a plurality of cells arranged in a matrix;
   (b) at least one word line connected to gates of cells arranged in a first direction among said cells;
   (c) at least one bit line for providing a data-writing signal to one of electrodes of cells arranged in a second direction among said cells, said second direction being perpendicular to said first direction;
   (d) at least one ground line for reading data out of the other of said electrodes of cells arranged in said second direction;
   (e) a plurality of sense-amplifiers associated with each of said sub-arrays for providing a sense-amplifying current to said bit line;
   (f) a plurality of row buffers connected to all of said sub-arrays for retaining data of a cell selected by said word line; and
   (g) a dirty bit for indicating whether data to be processed is stored in an associated row buffer.

6. The semiconductor memory as set forth in claim 5, further comprising a first controller for, if said dirty bit indicates that data to be processed is stored in an associated row buffer when data is to be transmitted to said associated row buffer, transmitting data stored in said associated row buffer to an associated sub-array before transmitting data into said associated row buffer.

7. The semiconductor memory as set forth in claim 6, further comprising a second controller for, if said dirty bit indicates that data to be processed is stored in an associated row buffer when data is to be transmitted to said associated row buffer, transmitting data stored in said associated row buffer to an empty row buffer before transmitting data into said associated row buffer.

8. The semiconductor memory as set forth in claim 7, wherein said second controller has a higher data-reading and data writing speed than that of said first controller.

9. The semiconductor memory as set forth in claim 5, further comprising a second controller for, if said dirty bit indicates that data to be processed is stored in an associated row buffer when data is to be transmitted to said associated row buffer, transmitting data stored in said associated row buffer to an empty row buffer before transmitting data into said associated row buffer.

10. The semiconductor memory as set forth in claim 5, wherein each of said sense-amplifiers is comprised of first and second sense-amplifiers positioned at opposite sides of each of said sub-arrays, and
    wherein said row buffers are comprised of first row buffers for retaining data written into said sub-arrays through said first sense-amplifiers and data input thereinto from said sub-arrays through said first sense-amplifiers, and second row buffers for retaining data written into said sub-arrays through said second sense-amplifiers and data input thereinto from said sub-arrays through said second sense-amplifiers, data transmission through said first and second row buffers being carried out in a time-sharing manner.

11. The semiconductor memory as set forth in claim 10, wherein each of sub-arrays is connected to said first sense-amplifier through a certain number of bit lines, and connected further to said second sense-amplifier through the same number of bit lines.

12. The semiconductor memory as set forth in claim 10, wherein some data is stored in said first and second row buffers.

13. The semiconductor memory as set forth in claim 5, wherein some data is stored in said row buffers.

14. A semiconductor memory comprising:
    (a) a plurality of sub-arrays each of which includes a plurality of cells; and
    (b) at least one row buffer connected to all of said sub-arrays data transmission between an external circuit and said sub-arrays being accomplished through said row buffer;
    wherein said row buffer is comprised of first row buffers for retaining data written into said sub-arrays in a first route and data input thereinto from said sub-arrays in said first route, and second row buffers for retaining data written into said sub-arrays in a second route and data input thereinto from said sub-arrays in said second route; and data transmission through said first and second row buffers being carried out in a time-sharing manner.

15. The semiconductor memory as set forth in claim 14, further comprising a dirty bit for indicating whether data to be processed is stored in an associated row buffer.

16. The semiconductor memory as set forth in claim 15, further comprising a first controller for, if said dirty bit indicates that data to be processed is stored in an associated row buffer when data is to be transmitted to said associated row buffer, transmitting data stored in said associated row buffer to an associated sub-array before transmitting data into said associated row buffer.

17. The semiconductor memory as set forth in claim 16, further comprising a second controller for, if said dirty bit indicates that data to be processed is stored in an associated row buffer when data is to be transmitted to said associated row buffer, transmitting data stored in said associated row buffer to an empty row buffer before transmitting data into said associated row buffer.

18. The semiconductor memory as set forth in claim 15, further comprising a second controller for, if said dirty bit indicates that data to be processed is stored in an associated row buffer when data is to be transmitted to said associated row buffer, transmitting data stored in said associated row buffer to an empty row buffer before transmitting data into said associated row buffer.

19. The semiconductor memory as set forth in claim 18, wherein said second controller has a higher data-reading and data-writing speed than that of said first controller.

20. The semiconductor memory as set forth in claim 14, wherein some data is stored in said row buffer.

21. The semiconductor memory as set forth in claim 15, wherein some data is stored in said first and second row buffers.

22. A method of driving a semiconductor memory having a plurality of sub-arrays each having a plurality of cells, comprising the steps of:

(a) transmitting a first signal to a selected word line of a selected sub-array when an external circuit transmits an access signal to said sub-array;

(b) transmitting a second signal to a first sense-amplifier connected to a first group of cells of said selected sub-array to thereby write data stored in a first row buffer, into a row of cells connected to said selected word line, or read data out of a row of cells connected to said selected word line, into said first row buffer;

(c) pre-charging said sub-array; and (d) transmitting a third signal to a second sense-amplifier connected to a second group of cells, of said selected sub-array, different from said first group of cells of said selected sub-array to thereby write data stored in a second row buffer, into a row of cells connected to said selected word line, or read data out of a row of cells connected to said selected word line, into said second row buffer.

23. The method as set forth in claim 22, further comprising the step of transmitting data stored in a row buffer to an associated sub-array before transmitting data into said row buffer, if data is already stored in said row buffer.

24. The method as set forth in claim 22, further comprising the step of transmitting data stored in a row buffer to another empty row buffer before transmitting data into said row buffer, if data is already stored in said row buffer.

25. The method as set forth in claim 22, further comprising the step of storing some data in one of said first and second row buffers.

* * * * *